United States Patent

Nambu

Patent Number: 6,136,722
Date of Patent: Oct. 24, 2000

[54] PLASMA ETCHING METHOD FOR FORMING HOLE IN MASKED SILICON DIOXIDE

[75] Inventor: Hidetaka Nambu, Tokyo, Japan

[73] Assignee: NEC Corporation, Tokyo, Japan

[21] Appl. No.: 09/172,860

[22] Filed: Oct. 15, 1998

[30] Foreign Application Priority Data

Oct. 15, 1997 [JP] Japan ................... 9-282020

[51] Int. Cl.⁷ .................................... H01L 21/00
[52] U.S. Cl. ................ 438/723; 216/79; 438/743
[58] Field of Search .................. 438/723, 712, 438/743; 216/67, 79; 156/345 P

[56] References Cited

U.S. PATENT DOCUMENTS 5,928,967  7/1999  Radens et al. ............... 438/743 X
6,001,699  12/1999  Nguyen et al. ............... 438/743 X

FOREIGN PATENT DOCUMENTS 8-92768  4/1996  Japan .

OTHER PUBLICATIONS

E. Ikawa, "Subjects on Dry Etching Technology for Coming Generation Device Process", *Technical Proceedings Semicon/Japan* 1993, pp. 405–411.

*Primary Examiner*—William Powell
*Attorney, Agent, or Firm*—Sughrue, Mion, Zinn, Macpeak & Seas, PLLC

[57] ABSTRACT

A plasma etching method is provided, which forms a penetrating hole with a size as small as approximately 0.3 $\mu$m or less and a high aspect ratio in a doped or undoped silicon dioxide film covered with a patterned masking film. This method is comprised of a step of forming a masking film with a window on a silicon dioxide film to be etched, and a step of selectively etching the silicon dioxide film through the window of the masking film using a fluorocarbon-based etching gas and a plasma in a reaction chamber, thereby forming a penetrating hole in the silicon dioxide film. During the step of selectively etching the silicon dioxide film, an etching condition is adjusted in such a way that a fluorocarbon polymer film having a ratio of carbon to fluorine (i.e., a C/F ratio) ranging from 1.1 to 1.8 is deposited on the masking film. The masking film preferably has a thickness of approximately 1 $\mu$m or less. It is preferred that this method is carried out using a surface-wave plasma etching apparatus.

20 Claims, 6 Drawing Sheets

PLASMA ETCHING METHOD FOR FORMING HOLE IN MASKED SILICON DIOXIDE

BACKGROUND OF THE INVENTION

1. Field of the Invention

The present invention relates to a plasma etching method for a silicon dioxide ($SiO_2$) film and more particularly, to a plasma etching method for forming a penetrating hole in a doped or undoped silicon dioxide film equipped with a mask thereon using a fluorocarbon ($C_n,F_m$)-based etching gas, which is preferably applied to semiconductor device fabrication.

2. Description of the Prior Art

In recent years, the design rule has been becoming lower and lower with the progressing integration degree of semiconductor integrated circuit devices (ICs). On the other hand, to planarize the surface of a $SiO_2$-based interlayer dielectric layer, the Chemical Mechanical Polishing (CMP) process has been being popularly used. Therefore, there has been a tendency that the interlayer dielectric layer becomes thicker.

Under such circumstance, contact holes formed through the interlayer dielectric layer tend to be not only smaller in size or diameter but also larger in depth. This means that the contact holes need to have not only small diameters but also high aspect ratios, where the aspect ratio is defined as a ratio of the depth of the contact holes to the diameter thereof.

Conventionally, as a microscopic processing method for $SiO_2$ films, plasma etching has been known and widely used in the field of semiconductor device fabrication. In plasma etching, for example, a fluorocarbon ($C_nF_m$)-based gas is introduced into a reaction chamber as an etching gas, where n is an integer ranging from 1 to 6 and m is an integer ranging from 4 to 14. Then, a specific high voltage is applied across electrodes to cause a glow discharge in the reaction chamber, thereby generating a plasma in the chamber. The molecules of the ($C_nF_m$)-based gas that has been introduced into the chamber collide with energetic electrons existing in the plasma, thereby inducing dissociation of the ($C_nF_m$)-based gas. In this case, typically, neutral dissociation and ionic dissociation of the ($C_nF_m$)-based gas occur simultaneously.

In the reaction chamber, active or reactive species, i.e., adherent and neutral radicals and molecules of fluorocarbon $C_nF_m$, which are generated by the neutral dissociation, tend to be deposited on a $SiO_2$ layer to be etched, thereby forming a film of fluorocarbon polymer hereon. At the same time as this deposition, energetic ions generated by the ionic dissociation tend to collide with the deposited fluorocarbon polymer film, thereby vaporizing the fluorocarbon polymer film and the underlying $SiO_2$ film. Thus, the $SiO_2$ film is etched as desired.

When the $SiO_2$ film to be etched is covered with a patterned masking film to form a penetrating hole with a high aspect ratio in the $SiO_2$ film, the etch selectivity of the $SiO_2$ film to the masking film needs to be as high as possible. If this necessity is accomplished, the $SiO_2$ film is selectively etched to have a desired topography according to the pattern of the masking film.

To realize a high etch selectivity of the $SiO_2$ film to be etched to the overlying masking film, various techniques have been developed.

An example of the known, developed techniques is to add gaseous carbon monoxide (CO) to a fluorocarbon-based etching gas. This technique is disclosed in a document written by E. Ikawa, Technical Proceedings Semicon/Japan 1993, pp. 405–411, which was entitled "Subjects on Dry Etching Technology for Coming Generation Device Process" and published in 1993.

In this conventional technique, addition of CO to the fluorocarbon-based etching gas increases the ratio of carbon (C) to fluorine (F), i.e., the (C/F) ratio, of the deposited fluorocarbon polymer film, thereby improving the sputtering or etching resistance property of the fluorocarbon polymer film. In other words, the etch rate of the fluorocarbon polymer film deposited on the masking film becomes low during the plasma etching process while the etch rate of the $SiO_2$ film as an etching object is kept approximately unchanged. As a consequence, the etch selectivity of the $SiO_2$ film to the masking film and the deposited fluorocarbon polymer film is increased.

Another example of the known, developed techniques is disclosed in the Japanese Non-Examined Patent Publication No. 8-92768 published in 1996. In this conventional technique, (i) a mixture of a $C_nF_m$-based gas and a neon (Ne) gas, (ii) a mixture of a CnFm-based gas, a Ne gas, and a Co gas, or (iii) a mixture of a $C_nF_m$-based gas, a helium (He) gas, and a CO gas is used as the etching gas. A silicon nitride ($Si_3N_4$) film is used as the masking or etching resist film.

In this conventional technique, due to the use of any one of the above mixtures (i), (ii) and (iii), the (C/F) ratio of the deposited fluorocarbon polymer film on the masking film is increased. As a result, the etch selectivity of the $SiO_2$ film to masking film and the deposited fluorocarbon polymer film becomes higher.

With the above-described two conventional plasma etching techniques, however, the following problems will occur.

Specifically, to form a penetrating hole with a smaller diameter or size such as approximately 0.30 μm or less in a $SiO_2$ film, an extremely thin masking film needs to be formed by a deep ultraviolet (UV) resist material in view of an necessary patterning accuracy. In this case, the etching resistance of the masking film becomes lower with the decreasing thickness of the same.

Therefore, it is difficult to form the small-sized penetrating hole (i.e., approximately 0.30 μm or less in diameter) with a high aspect ratio in the $SiO_2$ film by simply increasing the C/F ratio of the deposited fluorocarbon polymer film on the masking film as disclosed in the above-described conventional plasma etching techniques.

In fact, the inventor has never known any report that a penetrating hole with a diameter equal to or less than 0.25 μm and a high aspect ratio is formed in a $SiO_2$ film using a patterned masking film.

Thus, to deal with the fabrication processes for next-generation semiconductor devices, there has been the strong need of realizing a plasma etching method to form a penetrating hole with a small diameter of approximately 0.3 μm or less and a high aspect ratio in a $SiO_2$ film.

SUMMARY OF THE INVENTION

Accordingly, an object of the present invention is to provide a plasma etching method for forming a penetrating hole with a size as small as approximately 0.3 μm or less and a high aspect ratio in a doped or undoped silicon dioxide film covered with a patterned masking film.

Another object of the present invention is to provide a method for forming a penetrating hole with a size as small as approximately 0.3 μm or less and a high aspect ratio in a doped or undoped silicon dioxide film in which the plasma etching condition is readily optimized.

The above objects together with others not specifically mentioned will become clear to those skilled in the art from the following description.

A plasma etching method for forming a penetrating hole as small as approximately 0.3 μm or less in a doped or undoped silicon dioxide film according to the present invention is comprised of a step of forming a masking film with a window on a silicon dioxide film to be etched, and a step of selectively etching the silicon dioxide film through the window of the masking film using a fluorocarbon-based etching gas and a plasma in a reaction chamber, thereby forming a penetrating hole in the silicon dioxide film.

During the step of selectively etching the silicon dioxide film, an etching condition is adjusted in such a way that a fluorocarbon polymer film having a ratio of carbon to fluorine (i.e., a C/F ratio) ranging from 1.1 to 1.8 is deposited on the masking film.

With the plasma etching method according to the present invention, the C/F ratio of the fluorocarbon polymer film, which is deposited on the masking film during the step of selectively etching the silicon dioxide film, is adjusted to fall within the range from 1.1 to 1.8.

Therefore, the deposition rate of the fluorocarbon polymer film on a surface of the masking film is high enough for inhibiting an etching action applied to the masking film while the deposited fluorocarbon polymer film does not close the window of the masking film for the penetrating hole as small as approximately 0.3 μm or less.

Further, the deposition rate of the fluorocarbon polymer film on an unmasked area of the silicon dioxide film is low enough for allowing the unmasked area to be etched.

As a result, a penetrating hole with a diameter as small as approximately 0.3 μm or less and a high aspect ratio is able to be formed in the doped or undoped silicon dioxide film covered with the patterned masking film.

Additionally, during the step of selectively etching the silicon dioxide film, the fluorocarbon polymer film is deposited on an inner sidewall of the window of the masking film and on an inner sidewall of a progressing etched opening of the silicon dioxide film, which causes a sidewall blocking effect against the etching action. Thus, these sidewalls are scarcely applied with the etching action and consequently, a satisfactory etching anisotropy is realized.

Because a desired contact hole is formed by simply adjusting the C/F ratio of the deposited fluorocarbon polymer film to fall within the range from 1.1 to 1.8, the plasma etching condition is readily optimized.

DETAILED DESCRIPTION OF THE INVENTION

The inventor of the present invention made a thorough effort to solve the previously-described problem in the conventional plasma etching techniques. As a result of this, he found the following fact.

Specifically, when the C/F ratio of a fluorocarbon polymer film deposited on a masking film during plasma etching is adjusted to a value in the range from 1.1 to 1.8, the fluorocarbon polymer film tends to be deposited on a surface of the masking film and it is not deposited or it is difficult to be deposited on an unmasked area of the silicon dioxide film through the window of the masking film.

In other words, the deposition rate of the fluorocarbon polymer film on a surface of the masking film is high enough for inhibiting an etching action applied to the masking film while the deposited fluorocarbon polymer film does not close the window of the masking film for the penetrating hole as small as approximately 0.3 μm or less. Further, the deposition rate of the fluorocarbon polymer film on an unmasked area of the silicon dioxide film is low enough for allowing the unmasked area to be etched.

As a result, even if the masking film is extremely thin, a satisfactorily high etch selectivity of the silicon dioxide film t o the masking film is realized. This means that a penetrating hole with a diameter as small as approximately 0.3 μm or less and a high aspect ratio is able to be formed in the doped or undoped silicon dioxide film.

Additionally, during the step of selectively etching the silicon dioxide film, the fluorocarbon polymer film is deposited on an inner sidewall of the window of the masking film and on an inner sidewall of a progressing etched opening of the silicon dioxide film, which causes a sidewall blocking effect against the etching action. Thus, these sidewalls are scarcely applied with the etching action and consequently, a satisfactory etching anisotropy is realized.

The method according to the present invention was created based on the above-described fact thus found.

In the method according to the present invention, it is preferred that the etching condition is adjusted in such a way that the fluorocarbon polymer film having the C/F ratio ranging from 1.15 to 1.75 is deposited on the masking film. In this case, there is an additional advantage that the etch selectivity is higher than the case where the C/F ratio of the fluorocarbon polymer film is in the range from 1.2 to 1.6 and that the etch rate of the silicon dioxide film is sufficiently high.

Because of the same reason as above, it is more preferred that the etching condition is adjusted in such a way that the fluorocarbon polymer film having the C/F ratio ranging from 1.2 to 1.7 is deposited on the masking film.

In the method according to the present invention, as the fluorocarbon-based etching gas, any one of saturated and unsaturated aliphatic hydrocarbons may be used. The hydrogen (H) atoms of each of the saturated and unsaturated aliphatic hydrocarbons may be entirely or partially replaced with fluorine (F) atoms.

For example, $CF_4$, $CHF_3$, $CH_2F_2$, $C_2HF_5$, $C_2H_6$, or $C_4H_8$ may be preferably used. Within these saturated and unsaturated aliphatic hydrocarbons, it is more preferred that $CHF_3$, $CH_2F_2$, or $C_2HF_8$ is used. This is because a higher etch selectivity and a high etch rate of the silicon dioxide film are realized.

It is needless to say that at least two ones of the saturated and unsaturated aliphatic hydrocarbons may be used in combination as the fluorocarbon-based etching gas.

An inert gas such as He, Ne, Ar, Kr, or Xe may be used as a component of the fluorocarbon-based etching gas. Within these inert gases, He, Ne, or Ar is preferred because they are readily accessible. Ar is more preferred because it is not only readily accessible but also inexpensive.

To set the C/F ratio of the deposited fluorocarbon polymer film to a value within the range from 1.1 to 1.8, Co may be added as a component of the fluorocarbon-based etching gas. In other words, Co may be added to at least one of the saturated and unsaturated aliphatic hydrocarbons for producing the fluorocarbon-based etching gas. This is because the C/F ratio of the deposited fluorocarbon polymer film is readily set at a value within the range from 1.1 to 1.8 by controlling or adjusting the flow rates of a CO gas and at least one of the saturated and unsaturated aliphatic hydrocarbon gases.

When any one of the saturated and unsaturated aliphatic hydrocarbons which contains unreplaced hydrogen is used, there is an additional advantage that the C/F ratio of the deposited fluorocarbon polymer film is able to be set as a value within the range from 1.1 to 1.8 without the use of Co.

Even if the etching gas having the same composition is used, the C/F ratio of the deposited fluorocarbon film becomes different according to the sort or type of a plasma apparatus and an etching condition used. Therefore, the composition of the etching gas such as their flow rates needs to be properly adjusted according to the sort/type of the plasma etching apparatus and the etching condition.

Any type of plasma etching apparatuses may be used in the method according to the present invention. For example, a surface-wave plasma (SWP) etching apparatus, an electron-cyclotron-resonance (ECR) micro-wave plasma etching apparatus, an inductively-coupled plasma (ICP) etching apparatus, a helicon-wave plasma etching apparatus, a magnetron plasma etching apparatus, a radio-frequency plasma etching apparatus, or a two-frequency RIE plasma etching apparatus may be used.

However, it is preferred that the method according to the present invention is carried out using a surface-wave plasma (SWP) etching apparatus. This is because the SWP etching apparatus uses a surface wave and therefore, a good etch uniformity is realized.

The pressure in a reaction or etching chamber of a plasma etching apparatus is properly adjusted according to the type/sort of the etching apparatus. In general, if the pressure in the reaction chamber is excessively low, the deposited fluorocarbon polymer film does not have a thickness large enough for protecting the masking film against the etching action, resulting in an unsatisfactory etch selectivity. On the other hand, if the pressure in the reaction chamber is excessively high, the deposited fluorocarbon polymer film tends to have a large thickness and it tends to be deposited on the unmasked area of the silicon dioxide film through the window of the masking film. Thus, the releasability of the fluorocarbon polymer film degrades and the etch selectivity is unsatisfactory.

Due to the tests by the inventor, it is preferred that the pressure in the reaction chamber is set as a value in the range from 20 mTorr to 60 mTorr in a SWP etching apparatus. This is because a penetrating hole with a small size such as approximately 0.3 µm or less and a high aspect ratio is readily formed due to high etch selectivity.

It is more preferred that the pressure in the reaction chamber is set as a value in the range from 30 mTorr to 50 mTorr in a SWP etching apparatus, because of the same reason as the case of 20 mTorr to 60 mTorr.

As the masking film, a film made of any inorganic compound such as silicon nitride ($Si_3N_4$) may be used. However, an optically resist film (which is usually termed a photoresist film) is preferably used. If an inorganic compound film is used as the masking film, not only an additional step is necessary for processing the inorganic compound film itself but also an obtainable pattern accuracy is low. By using an optically resist film capable of pattering by exposure and development as the masking film, necessary patterning processes of the masking film are simplified and the window of the masking film is formed with high accuracy.

As the optically resist film, it is preferred that any one of the optically resist films having a chemical amplification property and capable of deep UV exposure is used. This is because the optically resist film can be exposed by an excimer laser (e.g., KrF laser) or electron beam, which makes it possible to pattern the optically resist film at very high accuracy.

It is preferred that the thickness of the optically resist film is thin according to the necessity for patterning the window of the same. If the optically resist film is thin, the etch resistance of the optically resist film will degrade. In the method according to the present invention, however, a satisfactorily high etch selectivity is realized even for the thin optically resist film and therefore, the thickness of the optically resist film may be set as approximately 1 µm or less without arising any problem.

Further, the thickness of the optically resist film may be set as approximately 0.8 µm or less. In this case, the advantages of the method according to the present invention are derived effectively. The thickness of the optically resist film may be set as approximately 0.5 µm or less, because the advantages of the method according to the present invention are derived more effectively. However, if the thickness of the optically resist film is extremely thin, the penetrating hole in the silicon dioxide film is difficult to have a high aspect ratio. Therefore, when the penetrating hole in the silicon dioxide film has an aspect ratio of approximately 6 or greater, it is preferred that the optically resist film has a thickness of approximately 0.2 µm or greater.

The window of the masking film defines the size of the penetrating hole in the silicon dioxide film. The method according to the present invention is suitable to the case where the window of the masking film has a size of approximately 0.3 µm or less, because the advantages of the present invention is derived effectively. The window of the masking film may have a size of approximately 0.25 µm or less, or approximately 0.15µm or less, because the advantages of the present invention is derived remarkably.

The window of the masking film and therefore the cross-sectional shape of the penetrating hole in the silicon dioxide film is usually circular or elliptical. However, the method according to the present invention is not limited to these shapes. It is needless to say that the window of the masking film and the penetrating hole of the silicon dioxide film may have any other shape than circular and elliptical shapes, such as square and rectangular shapes.

The penetrating hole in the silicon dioxide film preferably has an aspect ratio of approximately 6 or greater, because the advantages of the present invention is derived effectively. It is more preferred that the penetrating hole in the silicon dioxide film has an aspect ratio of approximately 7.5 or greater because the advantages of the present invention is derived more effectively.

In the method according to the present invention, the silicon dioxide film may be undoped or doped with any impurity. Specifically, not only an undoped silicon dioxide produced by a popular process such as thermal oxidation or Chemical Vapor Deposition (CVD) but also a doped silicon dioxide with an impurity such as boron (B) and/or phosphorus (P) may be used.

A silicon dioxide doped with boron has a glass property at room temperature and therefore, it is termed borosilicate glass (BSG). A silicon dioxide doped with phosphorus has a glass property at room temperature and therefore, it is termed phosphorsilicate glass (PSG). A silicon dioxide doped with both boron and phosphorus has a glass property at room temperature and therefore, it is termed borophosphorsilicate glass (BPSG).

The method according to the present invention is effectively applicable to a process of forming a small-sized contact or via hole with a high aspect ratio in a doped or undoped silicon dioxide film serving as an interlayer dielectric layer in a semiconductor device.

It was found that the method according to the present invention made it possible to form a contact hole with a diameter of approximately 0.12 μm and an aspect ratio of approximately 17.5 in a BPSG film.

In the method according to the present invention, an optimum etching condition is able to be found in the following way.

Specifically, first, the total flow rate of the fluorocarbon-based etching gas and the individual flow rates of the gaseous components of the etching gas are determined in such a way that the deposited fluorocarbon polymer film has a C/F ratio within the range from 1.1 to 1.8 while the pressure in the reaction chamber is fixed at a specific value.

Second, the pressure in the reaction chamber is adjusted or changed from the specific value so that the etch selectivity between the silicon dioxide film and the masking film is maximized. Thus, the optimum etching condition is found.

It is clear that the above optimization steps are very simple and readily performed.

BRIEF DESCRIPTION OF THE DRAWINGS

In order that the present invention may be readily carried into effect, it will now be described with reference to the accompanying drawings.

EXAMPLES

Figure 5:
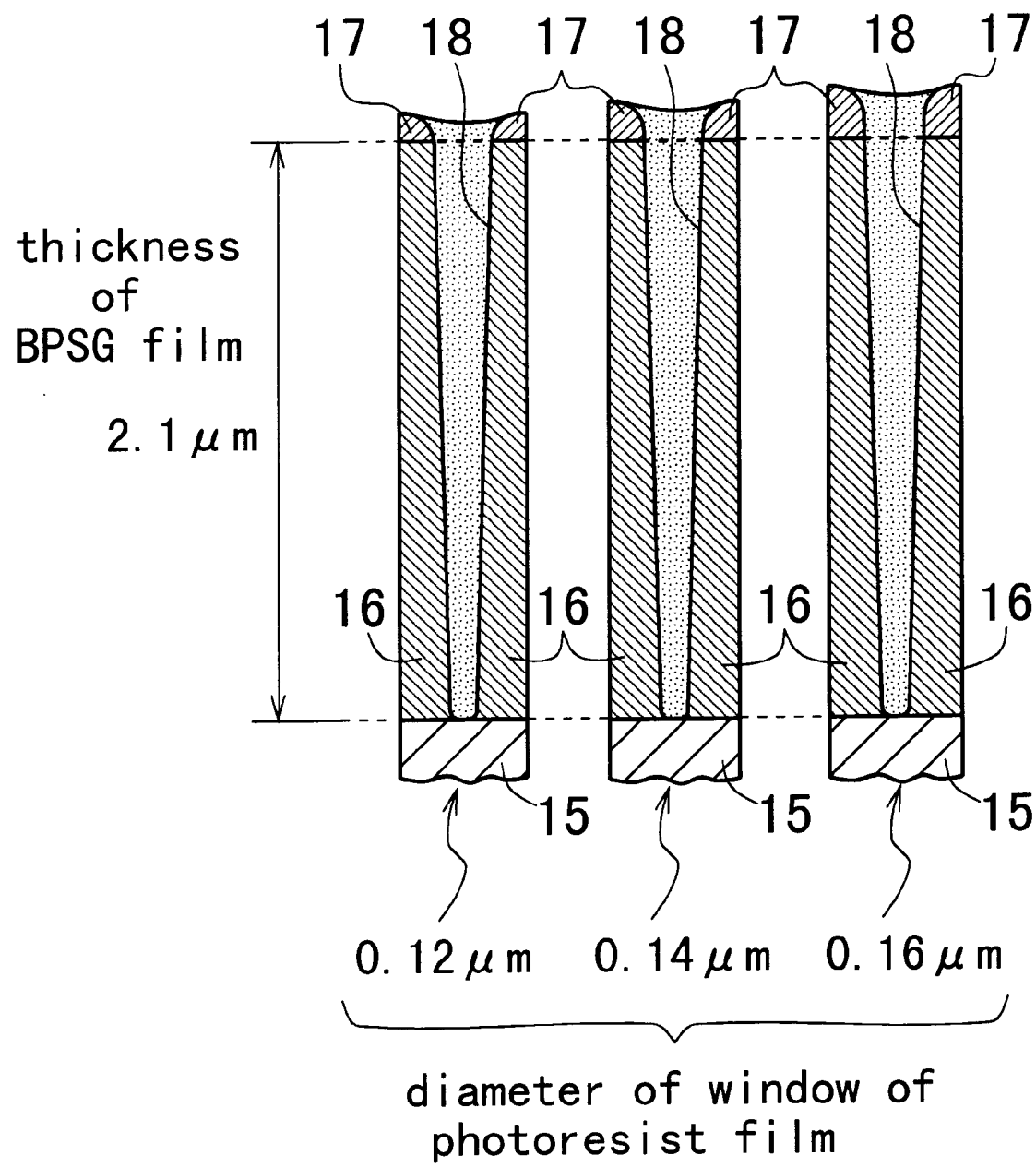
FIG. 5 is a partial, schematic cross section of the specimen etched by a plasma etching method according to a third embodiment of the present invention, in which contact holes having different diameters are formed to penetrate a BPSG film.

Preferred examples of the present invention will be described below referring to FIGS. 1 and 5.

First Example

Figure 1:
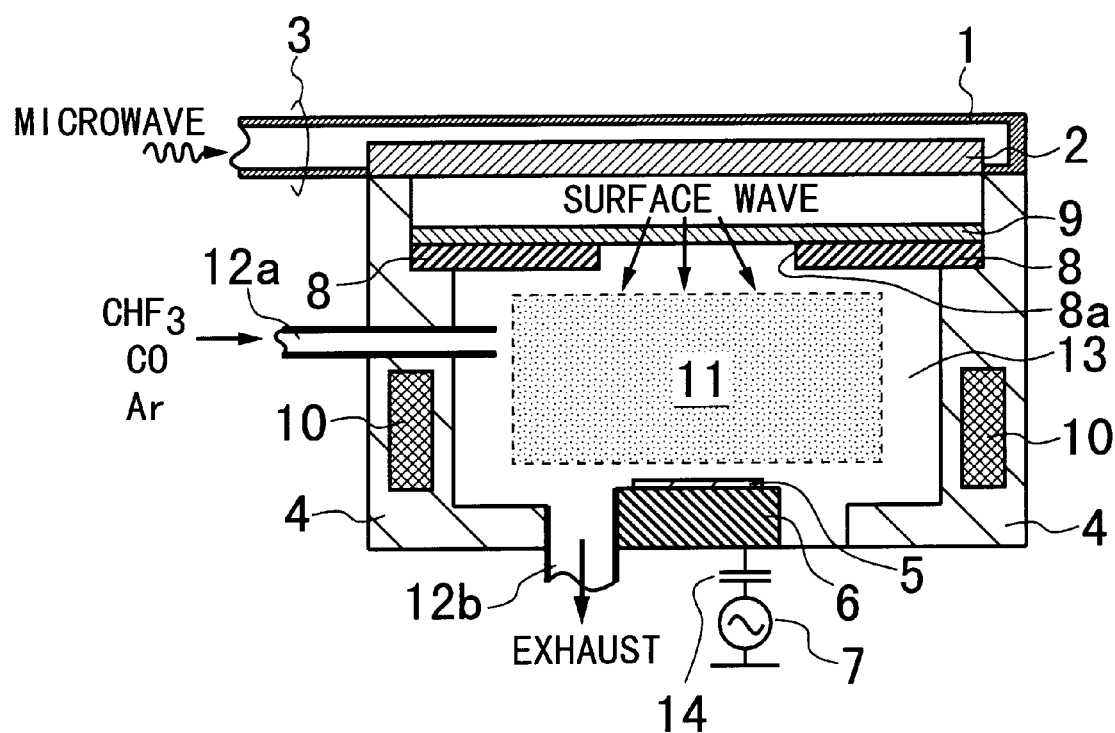
FIG. 1 is a schematic cross section of a surface-wave plasma etching apparatus used in a plasma etching method according to a first embodiment of the present invention.

A plasma etching method according to a first embodiment of the present invention was carried out using a surface-wave plasma (SWP) etching apparatus shown in FIG. 1, which forms a contact hole in a BPSG film.

As seen from FIG. 1, this plasama etching apparatus has a cylindrical reaction chamber 4 and a microwave waveguide 3 fixed to the chamber 4. The waveguide 3, which is formed by aluminum (Al) plates 1, has a cavity for propagating a microwave in its inside. The front end of the waveguide 3 is fixed to the top of the chamber 4.

A circular dielectric plate 2, which is formed by a fluoroplastic, is fixed to the front end of the waveguide 3. The dielectric plate 2 is located at the top of the chamber 4.

Another circular dielectric plate 9, which is formed by a ceramic, is provided in the reaction chamber 4. The dielectric plate 9 is fixed to the inner wall of the chamber 4 and is apart from the overlying dielectric plate 2.

A circular anode 8 is fixed to the circular dielectric plate 9 in the chamber 4. The anode 8 has a circular window 8a at the central position, through which a surface wave is emitted downward. The anode 8 is electrically connected to the ground.

A cathode 6 is provided in the chamber 4. The cathode 6 is fixed to the bottom of the chamber 4 to be opposite to the anode 8. The cathode 6 is designed for placing a specimen 5 or an etching object onto its top face.

A radio-frequency (RF) power supply 7 is provided outside the chamber 4 and is electrically connected to the cathode 6 through a capacitor 14. The RF power supply 7 applies a RF bias voltage to the cathode 6 and the specimen 5.

A heater 10 is provided in the sidewall of the chamber 4 to apply heat to the same, thereby keeping the inside of the reaction chamber 4 at a specific temperature.

A gas tube 12a is provided to penetrate the sidewall of the chamber 4. A fluorocarbon-based etching gas is supplied to the inside of the chamber 4 through the tube 12a.

An exhaust tube 12b is provided to penetrate the bottom wall of the chamber 4. The etching gas and etch products existing in the chamber 4 are evacuated or exhausted from the inside of the chamber 4 through the tube 12b.

The inner space of the reaction chamber 4 separated by the dielectric plate 9 and located below the dielectric plate 9 serves as a reaction or etching space 13.

On operation, a microwave is supplied to the inside of the reaction chamber 4 through the waveguide 3. The microwave thus supplied is focused to the dielectric plate 2 and then, it propagates along the plate 2. Thus, a surface wave is generated on the dielectric plate 2 and is emitted downward The surface wave thus generated propagates to the etching space 13 of the chamber 4 through a space between the dielectric plates 2 and 9, the dielectric plate 9, and the window 8a of the anode 8.

The anode 8 is electrically connected to the ground. Therefore, when a RF bias voltage is applied to the cathode 6 by the RF power supply 7, the bias voltage is applied across the anode and cathode 8 and 6. In this case, a glow discharge is generated in the fluorocarbon-based etching gas introduced into the etching space 13 of the chamber 4, thereby generating a plasma 11. The etching gas is dissolved by the plasma 11 and generate active or etching species.

Figure 2A:
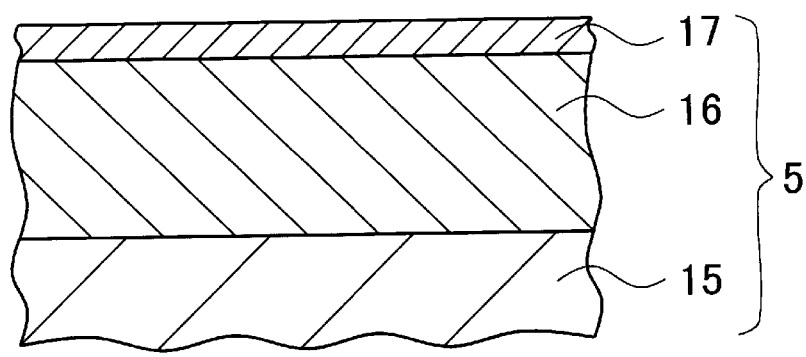
FIGS. 2A to 2E are schematic, partial cross sections of a specimen, which show the plasma etching method according to the first embodiment, respectively.

In the plasma etching method according to the first example, as shown in FIG. 2A, a single-crystal silicon (Si) substrate or wafer 15 was used to form the specimen 5. On a main surface of the Si substrate 15, a BPSG film 16 with a thickness of 2.1 μm was formed by a CVD process. Further, a deep-UV photoresist film 17 with a thickness of 0.8 μm was formed on the BPSG film 16. The state at this stage is shown in FIG. 2A.

Figure 2B:
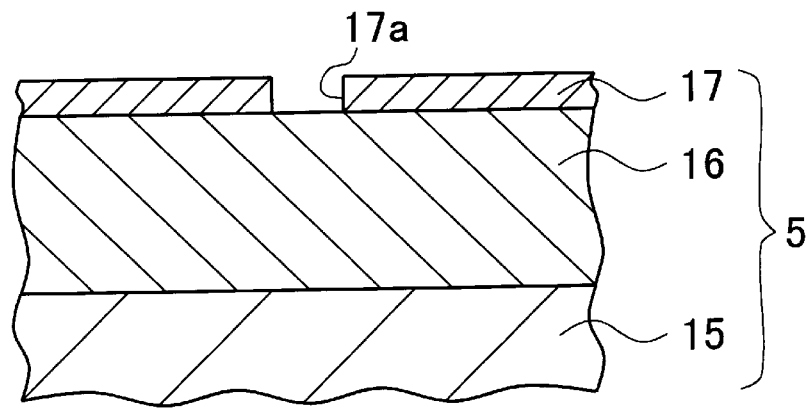

The photoresist film 17 had a circular window 17a with a diameter of 0.25 μm, as shown in FIG. 2B. The window 17a was formed by exposing the photoresist film 17 to light emitted from a KrF excimer laser using an exposure mask (not shown) and developing the photoresist film 17 thus exposed. The state at this stage is shown in FIG. 2B.

Then, the specimen 5, which was formed by the Si substrate 15, the BPSG film 16, and the patterned photoresist film 17, was placed on the cathode 6 in the etching space 13 of the reaction chamber 4 of the SWP etching apparatus shown in FIG. 1.

Subsequently, as the fluorocarbon-based etching gas, a gaseous mixture of $CHF_3$, CO, and Ar was introduced into the etching space 13 of the reaction chamber 4. The total flow rate of the $CHF_3$ and CO gases was kept at 80 sccm and at the same time, the individual flow rates of the $CHF_3$ and CO gases were changed in the following way.

(i) The flow rates of CO and $CHF_3$ were set as 0 and 80 sccm, respectively. In this case, the C/F ratio of a deposited fluorocarbon polymer film 20 (see FIG. 2C) was 1.1.

(ii) The flow rates of CO and $CHF_3$ were set as 16 sccm and 64 sccm, respectively. In this case, the C/F ratio of the deposited fluorocarbon polymer film 20 was 1.3.

(iii) The flow rates of CO and $CHF_3$ were set as 28 sccm and 52 sccm, respectively. In this case, the C/F ratio of the deposited fluorocarbon polymer film 20 was 1.6.

(iv) The flow rates of CO and $CHF_3$ were set as 64 sccm and 16 sccm, respectively. In this case, the C/F ratio of the deposited fluorocarbon polymer film 20 was 1.8.

The power and frequency of the RF bias applied to the cathode 6 by the RF power supply 7 was set as 600 W and 400 kHz, respectively. The power and frequency of the microwave supplied to the inside of the reaction chamber 4 was set as 1500 W and 2.45 GHz, respectively. The temperature of the sidewall of the chamber 4 was set as 180° C. by the heater 10. The temperature of the Si substrate 15 serving as a part of the specimen 5 was set as 65° C. The density of a plasma 11 (see FIGS. 1 and 2C) generated in the etching space 13 of the chamber 4 was $10^{12} cm^{-3}$.

The plasma etching process in the reaction chamber 4 was carried out as follows.

Figure 2C:
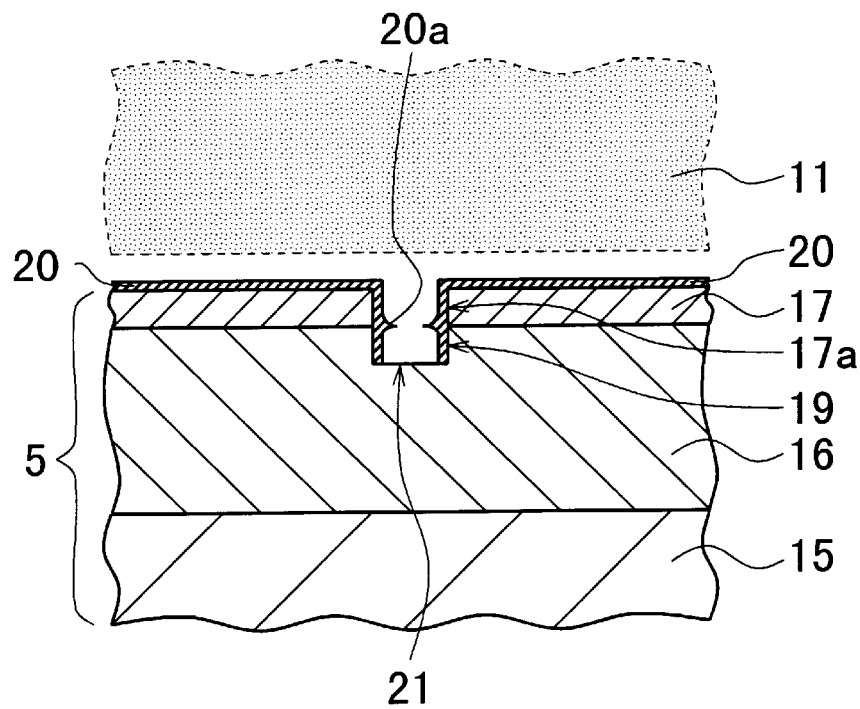

As shown in FIG. 2C, the specimen 5 was subjected to the etching action of the etching species (not shown) generated by the plasma 11 and the etching gas in the etching space 13 of the reaction chamber 4. Specifically, the whole photoresist film 17 was subjected to the etching action and at the same time, an unmasked area of the BPSG film 16 was subjected to the same etching action through the window 17a of the photoresist film 17.

During this etching process, a fluorocarbon polymer film 20 was deposited on the surface of the photoresist film 17, as shown in FIG. 2C. The fluorocarbon polymer film 20 serves to inhibit the etching action to the surface of the photoresist film 17. Also, during this etching process, the fluorocarbon polymer film 20 was further deposited on the inner sidewall of the window 17a of the photoresist film 17a and on an inner sidewall of a progressing etched opening or depression 19 of the BPSG film 16. The fluorocarbon polymer film 20 deposited on these inner sidewalls causes a sidewall blocking effect against the etching action. Thus, these sidewalls are scarcely applied with the etching action and consequently, a satisfactory etching anisotropy is realized.

On the other hand, the fluorocarbon polymer film 20 was scarcely deposited on the unmasked area of the BPSG film 16 through the window 17a of the photoresist film 17 and therefore, the unmasked area of the BPSG film 16 was etched by the etching action. Thus, the cylindrical opening or depression 19 was formed in the BPSG film 16, as shown in FIG. 2C. The opening or depression 19 was positioned at a location just below the window 17a of the photoresist film 17.

The reference numeral 21 in FIG. 2C denotes the bottom of the opening or depression 19 or the unmasked area of the BPSG film 16. The bottom of the opening or depression 19 corresponds to an etch front.

Although the fluorocarbon polymer film 20 tend to be deposited on the unmask ed are a of the BPSG film 17, the unmasked area was not covered with the fluorocarbon polymer film 20. This phenomenon was due to the lower deposition ate of the fluorocarbon polymer film 20 than the etch rate of the same. Accordingly, the BPSG film 16 was selectively etched at the unmasked area 21, resulting in the opening or depression 19 in the BPSG film 16.

As shown in FIG. 2C, the deposited fluorocarbon polymer film 20 had a protrusion 20a radially and inwardly protruded from a vertically extending part of the fluorocarbon polymer film 20 which was located in the window 17a of the photoresist film 17 and the opening or depression 19 of the BPSG film 16. The protrusion 20a was formed by the fact that the component atoms of the deposited fluorocarbon polymer film 20 contained the deposition directions that were not perpendicular to the surface of the photoresist film 20.

Figure 2D:
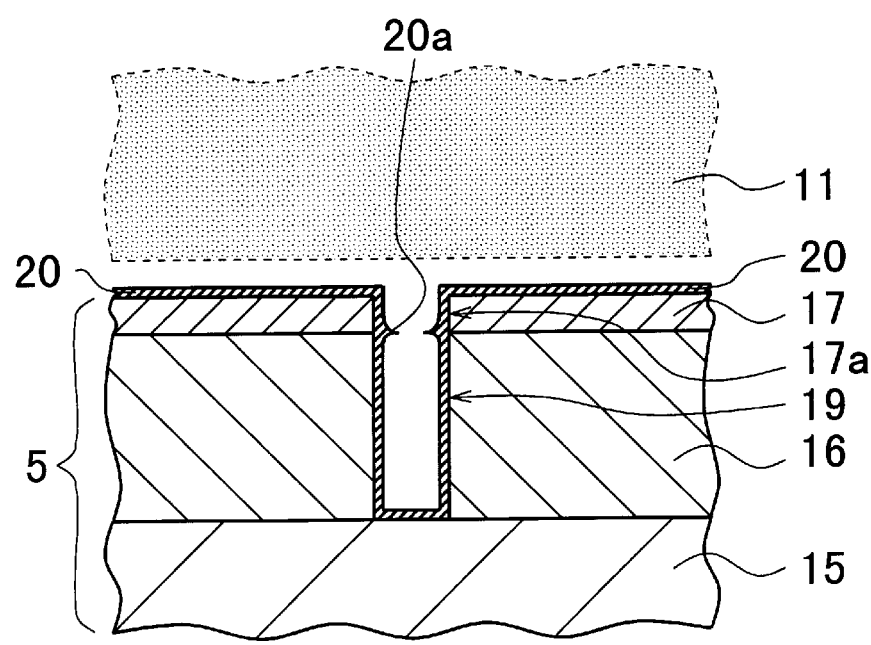

During the etching process, the etch front 21 progressed downward until the main surface of the Si substrate 15 was exposed, as shown in FIG. 2D. The etch rate of the Si substrate 15 was very low with respect to the etching action and therefore, no further progress of the etch front 21 took place in this etching process. As a result, the fluorocarbon polymer film 20 was deposited on the exposed surface area of the substrate 15 also. The state at this stage is shown in FIG. 2D.

Figure 2E:
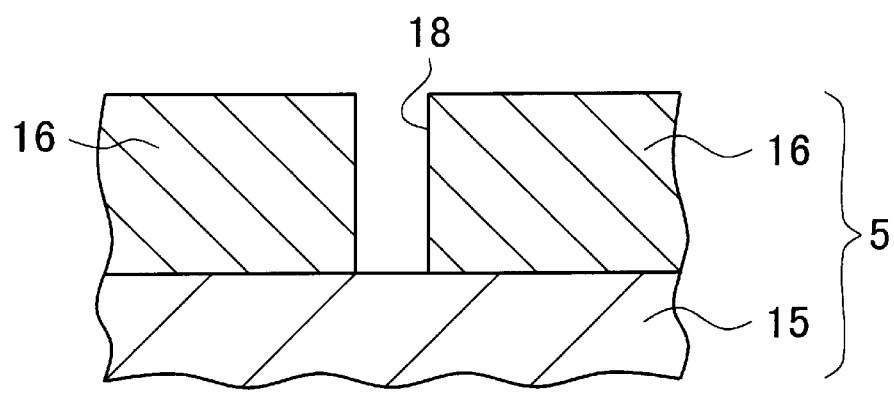

Finally, the deposited fluorocarbon polymer film 20 and the photoresist film 17 were removed by another etching or ashing process using an oxygen ($O_2$) plasma generated in the etching space 13 of the chamber 4. Thus, a cylindrical contact hole 18 was formed to penetrate the BPSG film 16, as shown in FIG. 2E.

Figure 3:
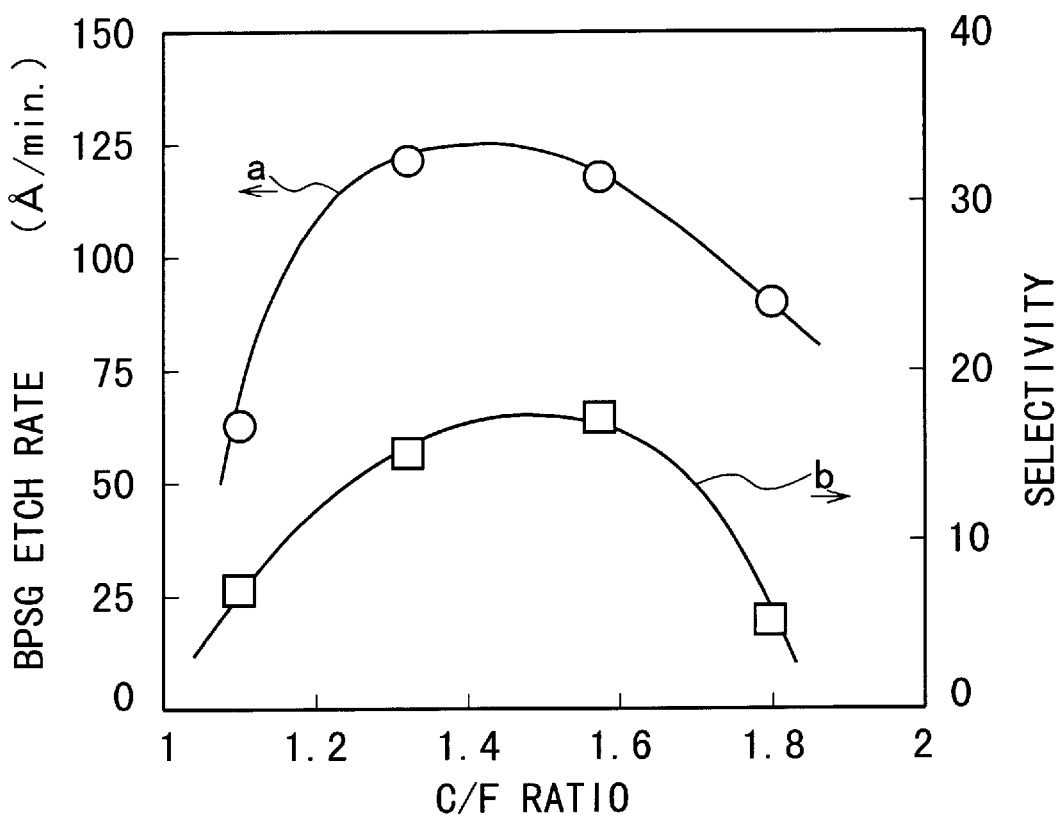
FIG. 3 is a graph showing the relationship of the etch rate and etch selectivity of the BPSG film with the C/F ratio of the deposited fluorocarbon polymer film in the plasma etching method according to the first embodiment.

FIG. 3 shows the relationship of the etch rate of the BPSG film 16 and the C/F ratio of the deposited fluorocarbon polymer film 20 and the relationship of the etch selectivity between the BPSG film 16 and the photoresist film 17 in the plasma etching method according to the first example. In FIG. 3, the curve a represents the etch rate and the curve b represents the etch selectivity.

As seen from FIG. 3, the etch selectivity was equal to 7.5 or greater within the range where the C/F ratio of the deposited fluorocarbon polymer film 20 was limited to a value within a range from 1.1 to 1.8. Thus, it was found that a satisfactorily high etch selectivity was realized when the C/F ratio of the fluorocarbon polymer film 20 was set within a range from 1.1 to 1.8.

Moreover, the contact hole 18 of the BPSG film 16 was observed by a scanning electron microscope (SEM). As a result, it was found that the inner sidewall of the contact hole 18 had a taper of 80 degrees or higher with respect to the main surface of the substrate 15. Also, it was found that no etch residue was observed at the bottom of the contact hole 18.

The C/F ratio of the deposited fluorocarbon polymer film 20 was measured in the following way.

Another Si substrate 15, on which the same BPSG film 16 and the same photoresist film 17 were formed, was prepared as the specimen 5. Then, this specimen 5 was placed on the cathode 6 of the plasma etching apparatus shown in FIG. 1. Then, under the same etching conditions as the above cases (i) to (iv), a fluorocarbon polymer film was deposited on the photoresist film 17 without applying the RF bias voltage to the cathode 6, i.e., without generating the plasma 11. The fluorocarbon polymer film 20 thus deposited was subjected to analysis by the X-ray photoelectronic spectroscopy (XPS), thereby measuring the C/F ratio of the fluorocarbon polymer film 20.

Second Example

A plasma etching method for forming a contact hole in a BPSG film according to a second example of the present invention was carried out using the same SWP etching apparatus shown in FIG. 1 and the same specimen 5 shown in FIG. 2A.

The etching process was carried out under the same etching condition as the method according to the first example except that the flow rates of the CO and $CHF_3$ gases were adjusted in such a way that the C/F ratio of the fluorocarbon polymer film 20 was approximately equal to 1.5, and that the pressure in the etching space 13 of the reaction chamber 4 was changed from 10 mTorr to 60 mTorr.

Figure 4:
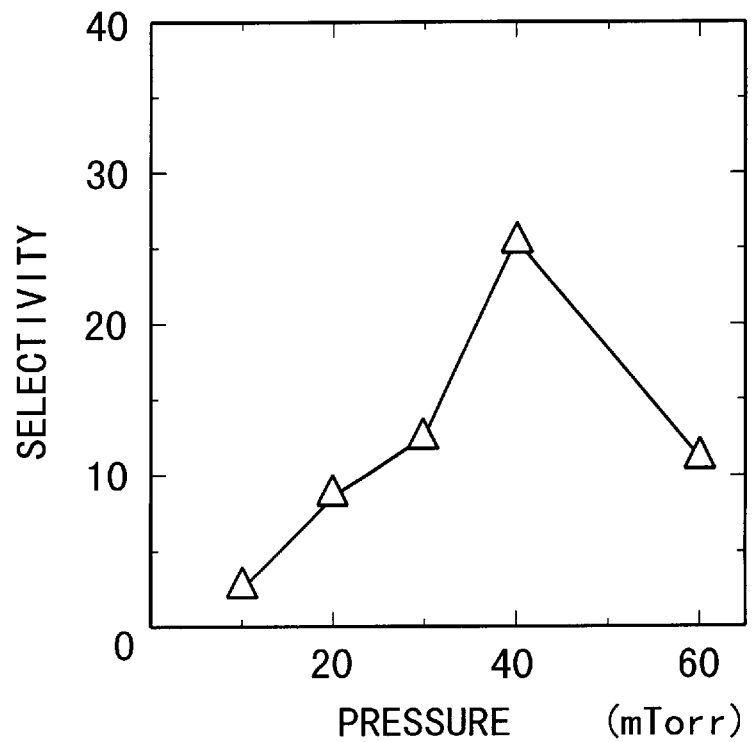
FIG. 4 is a graph showing the relationship of the etch selectivity between the photoresist film and the BPSG film with the pressure in the reaction chamber in the plasma etching method according to a second embodiment of the present invention.

FIG. 4 shows the relationship of the etch selectivity between the BPSG film 16 and the photoresist film 17 with the pressure of the reaction space 13 in the method according to the second embodiment.

It was found from FIG. 4 that a high etch selectivity of 7.5 or greater was realized within the range where the pressure in the etching space 13 was set as a value in the range from 20 mTorr to 60 mTorr.

Moreover, the contact hole 18 of the BPSG film 16 was observed in the same way as the first example. As a result, it was found that the inner sidewall of the contact hole 18 had a taper of 80 degrees or higher with respect to the main surface of the substrate 15. Also, it was found that no etch residue was observed at the bottom of the contact hole 18.

Third Example

A plasma etching method for forming a contact hole in a BPSG film according to a third example of the present invention was carried out using the same SWP etching apparatus shown in FIG. 1.

Regarding the specimen 5, unlike the first and second examples, the thickness of the deep-UV photoresist film 17 as set as 0.5 $\mu$m, which was thinner than that of the first and second examples. Further, the deep-UV photoresist film 17 had three circular windows 17a with different diameters of 0.16 $\mu$m, 0.14 $\mu$m, and 0.12 $\mu$m, which were smaller than that of the first and second examples.

The etching process was carried out under the same etching condition as the method according to the first example except that the flow rates of the CO and $CHF_3$ gases were respectively set as 32 sccm and 48 sccm so that the fluorocarbon polymer film 20 had a C/F ratio of 1.5, and that the pressure in the etching space 13 of the reaction chamber 4 was set as 30 mTorr.

As a result, the etch selectivity between the BPSG film 16 and the photoresist film 17 was 12.

Further, the contact holes 18 of the BPSG film 16 was observed by using a SEM prior to removal of the photoresist film 17. As a result of this, as shown in FIG. 5, it was found that the contact holes 19 each having a taper of approximately 80 degrees or greater with respect to the main surface of the substrate 15 were formed in the BPSG film 16. Also, it was found that the contact holes 19 had the maximum diameters of about 0.16 $\mu$m. 0.14 $\mu$m, and 0.12 $\mu$m.

The contact hole 19 with the maximum diameter of about 0.12 $\mu$m had an aspect ratio of about 17.5 (=2.1/0.12).

In the above-mentioned first to third examples, if the C/F ratio of the deposited fluorocarbon polymer film 20 is kept within the range from 1.1 to 1.8 and the etch rate of the BPSG film 16 is kept at a level where the productivity of the semiconductor device does not become excessively low, the RF power, microwave power, and the total flow rate of the etching gas are optionally changed. Also, the temperature of the silicon substrate 15 may be set at any value within a range from 40°C. to 80° C.

Although a SWP etching apparatus was used in the first to third examples, the present invention is not limited thereto. Any other type of the plasma etching apparatuses than the SWP etching apparatus may be used for the plasma etching method according to the present invention.

Additionally, a BPSG film, which is one of the doped silicon dioxide films and a typical example of the interlayer dielectric layer in the semiconductor devices, is used in the first to third examples. However, the present invention may be applied to any other sort/type of silicon dioxide films. For example, an undoped silicon dioxide film, which is typically formed by thermal oxidation or CVD may be used. A PSG film, which is a doped silicon dioxide film doped with phosphorus, or a BSG film, which is a doped silicon dioxide film doped with boron, may be used, The substrate 15 may be any other material than single-crystal silicon.

While the preferred examples of the present invention has been described, it is to be understood that modifications will be apparent to those skilled in the art without departing from the spirit of the invention. The scope of the invention, therefore, is to be determined solely by the following claims.

What is claimed is:

1. A plasma etching method for forming a penetrating hole as small as approximately 0.3 $\mu$m or less in a doped or undoped silicon dioxide film, which is comprised of a step of forming a masking film with a window on a silicon dioxide film to be etched, and a step of selectively etching said silicon dioxide film through said window of said masking film using a fluorocarbon-based etching gas and a plasma in a reaction chamber, thereby forming a penetrating hole in said silicon dioxide film;

characterized in that during the step of selectively etching said silicon dioxide film, an etching condition is adjusted in such a way that a fluorocarbon polymer film having a ratio of carbon to fluorine ranging from 1.1 to 1.8 is deposited on said masking film.

2. The method as claimed in claim 1, wherein the C/F ratio of said fluorocarbon polymer film is in a range from 1.15 to 1.75.

3. The method as claimed in claim 1, wherein the C/F ratio of said fluorocarbon polymer film is in a range from 1.2 to 1.8.

4. The method as claimed in claim 1, wherein said fluorocarbon-based etching gas is one selected from the group consisting of $CHF_3$, $CH_2F_2$, and $C_2HF_5$.

5. The method as claimed in claim 1, wherein said fluorocarbon-based etching gas contains an inert gas as its component.

6. The method as claimed in claim 1, wherein said fluorocarbon-based etching gas contains a CO gas as its component.

7. The method as claimed in claim 1, wherein the step of selectively etching said silicon dioxide film is carried out by a surface-wave plasma etching apparatus.

8. The method as claimed in claim 1, wherein a pressure in said reaction chamber is set as a value in the range from 20 mTorr to 60 mTorr in a SWP etching apparatus.

9. The method as claimed in claim 1, wherein the pressure in said reaction chamber is set as a value in the range from 30 mTorr to 40 mTorr in a SWP etching apparatus.

10. The method as claimed in claim 1, wherein said masking film is formed by an optically resist film.

11. The method as claimed in claim 1, wherein said masking film has a thickness of approximately 1 μm or less.

12. The method as claimed in claim 1, wherein said penetrating hole has an aspect ratio of approximately 6 or greater.

13. The method as claimed in claim 1, wherein said silicon dioxide film is doped with at least one impurity selected from the group consisting of boron and phosphorus.

14. A plasma etching method for forming a penetrating hole as small as approximately 0.3 μm or less in a silicon dioxide film, comprising the steps of:

(a) forming a masking film with a window on a doped or undoped silicon dioxide film;

(b) placing said silicon dioxide film with said masking film in a reaction chamber;

(c) introducing a fluorocarbon-based etching gas into said chamber in which said silicon dioxide film with said masking film has been placed;

(d) generating plasma in said chamber using said fluorocarbon-based etching gas introduced into said chamber; and (e) selectively etching said silicon dioxide film using said plasma and said masking film, thereby forming said penetrating hole in said silicon dioxide film;

wherein in the step (e), a fluorocarbon polymer film having a ratio of carbon to fluorine ranging from 1.1 to 1.8 is deposited on said etching resist film.

15. The method as claimed in claim 14, wherein said fluorocarbon-based etching gas is one selected from the group consisting of $CHF_3$, $CH_2F_2$, and $C_2HF_5$.

16. The method as claimed in claim 14, wherein the step (e) of selectively etching said silicon dioxide film is carried out by a surface-wave plasma etching apparatus.

17. The method as claimed in claim 16, wherein a pressure in said reaction chamber is set as a value in the range from 20 mTorr to 60 mTorr in a SWP etching apparatus.

18. The method as claimed in claim 14, wherein said masking film has a thickness of approximately 1 μm or less.

19. The method as claimed in claim 14, wherein said penetrating hole has an aspect ratio of approximately 6 or greater.

20. The method as claimed in claim 14, wherein a total flow rate of said fluorocarbon-based etching gas and individual flow rates of gaseous components of said etching gas are determined in such a way that said deposited fluorocarbon polymer film has a C/F ratio within the range from 1.1 to 1.8 while a pressure in said reaction chamber is fixed at a specific value;

and wherein, the pressure in said reaction chamber is adjusted from the specific value so that the etch selectivity between said silicon dioxide film and said masking film is maximized, thereby optimizing an etching condition.

* * * * *

UNITED STATES PATENT AND TRADEMARK OFFICE
CERTIFICATE OF CORRECTION

PATENT NO.: 6,136,722
DATED: October 24, 2000
INVENTOR(S): Hidetaka NAMBU

It is certified that error(s) appears in the above-identified patent and that said Letters Patent is hereby corrected as shown below:

Column 1, line 12, delete "$(C_n, F_m)$" insert --$(C_nF_m)$--.

Column 2, line 23, delete "CnFm" insert --$C_nF_m$--.

Column 4, line 30, delete "1.6" insert --1.8--;

line 46, delete "$C_zHF_8$" insert --$C_zHF_5$--.

Column 5, line 5, delete "Co" insert --CO--.

Column 10, line 4, delete "unmask ed are a" insert --unmasked area--;

line 7, delete "ate" insert --rate--

Signed and Sealed this

Twenty-second Day of May, 2001

Attest:

NICHOLAS P. GODICI

Attesting Officer      Acting Director of the United States Patent and Trademark Office